US006552774B2

(12) United States Patent
Hase et al.

(10) Patent No.: US 6,552,774 B2
(45) Date of Patent: Apr. 22, 2003

(54) EXPOSURE APPARATUS

(75) Inventors: Tomoharu Hase, Tochigi (JP); Yukio Yamane, Tokyo (JP); Yoshinori Miwa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/746,189

(22) Filed: Dec. 26, 2000

(65) Prior Publication Data
US 2001/0030739 A1 Oct. 18, 2001

(51) Int. Cl.[7] ............................ G03B 27/42; G03B 27/54
(52) U.S. Cl. ............................................ 355/53; 355/67
(58) Field of Search ...................... 355/53, 55, 67–71, 355/72–76; 356/399–401; 359/619; 250/548

(56) References Cited

U.S. PATENT DOCUMENTS 4,822,182 A * 4/1989 Matsushita et al. ......... 384/107
5,153,773 A * 10/1992 Muraki et al. ............... 359/619
5,253,110 A * 10/1993 Ichihara et al. ............. 359/619
5,300,971 A * 4/1994 Kudo .......................... 355/67
5,604,591 A * 2/1997 Kitagawa .................... 356/351
5,789,734 A * 8/1998 Torigoe et al. ............ 250/201.2

FOREIGN PATENT DOCUMENTS

| JP | 363174802 A | * | 7/1988 |
| JP | 6-216000 | | 8/1994 |

* cited by examiner

Primary Examiner—Hung Henry Nguyen
(74) Attorney, Agent, or Firm—Fitzpatrick, Cella, Harper & Scinto

(57) ABSTRACT

An exposure apparatus for transferring a pattern onto an object. The apparatus includes an optical member constituting part of an optical system arranged between a light source and the object, a rotor having a hole extending in an axial direction thereof, the optical member being mounted in the hole, a stator, the rotor and the stator constituting a motor for rotating the optical member, and a non-contact bearing for supporting the rotor.

25 Claims, 6 Drawing Sheets

FLOW OF MANUFACTURE OF SEMICONDUCTOR DEVICE

WAFER PROCESS

EXPOSURE APPARATUS

FIELD OF THE INVENTION

The present invention relates to an exposure apparatus and method and a device manufacturing method and, more particularly, to an exposure apparatus and method for transferring a pattern onto an object such as a substrate, and a device manufacturing method.

BACKGROUND OF THE INVENTION

An increase in the integration degree of semiconductor devices such as ICs and LSIs has progressed rapidly, and micropatterning techniques for semiconductor wafers have also been developed remarkably. In the projection exposure technique, as the central issue of micropatterning techniques, an improvement in resolution is indispensable and is realized by decreasing the wavelength of exposure light. A laser beam is utilized as short-wavelength exposure light. Because the laser beam has a high coherence, while it passes through an illumination optical system, interference occurs to form interference fringes called a speckle pattern, leading to nonuniform exposure.

For this reason, in order to decrease the contrast of the interference fringes, a projection optical system utilizing a laser beam has an optical member within its illumination optical system to deflect a beam. Exposure is performed while changing the phase of the interference fringes in units of pulses of the laser beam by moving this optical member during exposure. This levels off the influence of the interference fringes, so that the illumination distribution within the shot region is made uniform to decrease nonuniform exposure. Above all, a method of rotating a wedge prism about an optical axis as the center is effective, and has thus been put into practical use.

As the exposure light, light from an i-line ($\lambda$=365 nm), a KrF excimer laser ($\lambda$-248 nm), and the like has been put into practical use, and a projection exposure apparatus using an ArF excimer laser ($\lambda$=193 nm) as the light source has also been developed. Such short-wavelength exposure light is obtained in, e.g., an exposure apparatus utilizing an i-line, by using a filter for transmitting only a beam with a desired wavelength from beams within a wide wavelength band emitted from a mercury lamp as a light source, or a wavelength-selective thin film (an optical thin film deposited on the surface of a lens or mirror to transmit or reflect only a beam with a desire wavelength). These days, as the throughput increases and the pattern line width decreases, exposure light with a higher power is required, and a decrease in band of the exposure light is required.

In the exposure apparatus utilizing an i-line (wavelength $\lambda$=365 nm) and an exposure apparatus utilizing exposure light with a wavelength shorter than that of the i-line, due to a decrease in wavelength, exposure light is known to cause impurities in air to photochemically react with oxygen. The reaction product (fogging material) produced by this reaction attaches to a glass member to make it opaque or fogged.

A typical example of materials that cause fogging is ammonium sulfate $(NH_4)_2SO_4$. For example, ammonium sulfate $(NH_4)_2SO_4$ is generated when sulfur dioxide $SO_2$, excited upon absorption of light energy, reacts (is oxidized) with oxygen in air. Ammonium sulfate is whitish, and fogs an optical member such as a lens or mirror upon attaching to its surface.

Exposure light is scattered and absorbed by ammonium sulfate, so the transmittance of the optical member decreases. In particular, when exposure light, such as a KrF excimer laser, in a short wavelength range of 248 nm shorter than that of the i-line, or less is utilized, the exposure light causes a stronger photochemical reaction. This not only fogs the optical member but also generates ozone out of oxygen in air. Ozone has a nature of absorbing exposure light together with the remaining oxygen. For this reason, the exposure light decreases its light amount before it reaches a photosensitive substrate. In order to compensate for this, the exposure time must be prolonged, resulting in a small throughput.

In one technique proposed in view of the foregoing, a lens barrel, in which a glass member such as a lens is placed, is arranged in a housing with a sealed structure, and the housing and lens barrel are filled with an inert gas. This maintains the oxygen concentration low to prevent generation of ozone (Japanese Patent Application No. 6-216000). According to this technique, a flow path for flowing the inert gas into the housing and lens barrel is provided, so the oxygen concentration in the space where the glass member is arranged remains low. Accordingly, an oxidizing reaction in the photochemical reaction process is prevented, generation of a material that causes fogging is suppressed, and fogging of the optical member is prevented. Also, generation of ozone from oxygen by the exposure light is prevented effectively.

However, even in the illumination optical system with the structure as described above, optical elements in its house and lens barrel can be contaminated by organic molecules. These molecules are probably generated when chemicals and the like used during manufacture and machining remain in the components that make up the illumination optical system on the component, or an adhesive used in the housing or lens barrel is partly evaporated.

Depending on the situation in the manufacture, for example, the ambient air is contaminated by organic molecules generated from an adhesive layer between the substrate and photoresist, and these molecules may enter the housing or lens barrel. If the organic molecules are present in the housing or lens barrel even only in a low concentration, they can destructively affect the projection lens system. More specifically, the organic molecule particles can be decomposed by the exposure light and then be deposited on the optical element to form a carbon film or a carbon-containing film on their surfaces, to eventually decrease the effective transmittance of the optical elements to a non-allowable degree.

Therefore, dust and unwanted gas sources must be eliminated from the interiors of the housing and lens barrel. Regarding glass components and mechanical parts, cutting oil and the like used for machining them must be eliminated or washed off completely.

As a mechanism for rotating the wedge prism which decreases the adverse influence of the interference fringes, ball bearings, a stepping motor, a DC motor, an AC motor, and the like have conventionally been used. With these ball bearings and motors, the structural members produce friction and therefore require lubricant oil or the like. When the bearing and the motors are arranged in the lens barrel of the illumination system, it generates dust by friction, or unwanted gas from the lubricant oil or the like in the housing. Also, since the motor and a driving power transmitting mechanism projects outside the housing, the entire apparatus cannot be downsized and the housing cannot be hermetically sealed.

SUMMARY OF THE INVENTION

The present invention has been made in view of the above situation, and has as its main object to decrease the adverse influence of interference fringes formed by exposure light while suppressing dust and unwanted gases.

It is a subsidiary object of the present invention to suppress an increase in the size of an exposure apparatus when a mechanism for decreasing the adverse influence of the interference fringes is provided.

According to the first aspect of the present invention, there is provided an exposure apparatus for transferring a pattern onto an object, comprising an optical member constituting part of an optical system arranged between a light source and the object, a moving body which moves while supporting the optical member, a non-contact bearing for supporting the moving body, and a driving mechanism for moving the moving body together with the optical member.

According to a preferable embodiment of the present invention, the optical member includes an optical element for changing a phase of interference fringes formed on the object with exposure light.

According to a preferable embodiment of the present invention, the driving mechanism applies energy to the moving body without coming into contact with it. Also, the driving mechanism includes a rotor of a motor and a stator of the motor. The rotor has a hole extending in an axial direction thereof, and the optical member is mounted in the hole.

According to a preferable embodiment of the present invention, for example, the optical member is a prism that changes a light-deflecting direction upon moving.

According to a preferable embodiment of the present invention, the non-contact bearing is a gas bearing. The exposure apparatus preferably further comprises a flow path for guiding a gas supplied to the gas bearing to a space in a housing that surrounds the optical member and other optical members.

According to a preferable embodiment of the present invention, the exposure apparatus preferably further comprises a flow path through which a gas which passes through the driving mechanism flows from a space in a housing that surrounds the optical member and other optical members to outside of the apparatus.

According to a preferable embodiment of the present invention, the exposure apparatus further comprises a flow path through which a gas flows from a space in a housing that surrounds the optical member and other optical members to outside the apparatus through the bearing.

According to a preferable embodiment of the present invention, the exposure apparatus preferably further comprises a window member for partitioning a space including the optical member, the moving body, the bearing, and the driving mechanism, and a space including other optical members from each other.

According to a preferable embodiment of the present invention, the gas bearing uses an inert gas such as nitrogen gas or helium gas, or clean dry air.

According to a preferable embodiment of the present invention, the non-contact bearing may be a magnetic bearing.

According to a preferable embodiment of the present invention, the optical member, the moving body, the bearing, and the driving mechanism are arranged in an illumination optical system which illuminates an original plate where a pattern to be projected onto the object is formed.

According to the second aspect of the present invention, there is provided an exposure apparatus for transferring a pattern onto an object, comprising an optical member constituting part of an optical system arranged between a light source and the object, a moving body which moves while supporting the optical member, a bearing for supporting the moving body, a driving mechanism for moving the moving body together with the optical member, and a flow path through which a gas flows form a space in a housing that surrounds the optical member and other optical members to outside the apparatus through the bearing.

According to the third aspect of the present invention, there is provided an exposure apparatus for transferring a pattern onto an object, comprising an optical member constituting part of an optical system arranged between a light source and the object, a moving body which moves while supporting the optical member, a bearing for supporting the moving body, a driving mechanism for moving the moving body together with the optical member, and a flow path through which a gas which passes through the driving mechanism flows from a space in a housing that surrounds the optical member and other optical members to outside the apparatus.

According to the fourth aspect of the present invention, there is provided an exposure method of transferring a pattern onto an obeject, comprising the steps of arranging the object at a predetermined position, and while supporting and moving an optical member constituting part of an optical system arranged between a light source and the obeject with a non-contact bearing, transferring a pattern onto the object with light that has passed through the optical system.

According to the fifth aspect of the present invention, there is provided an exposure method of transferring a pattern onto an object, comprising the steps of arranging the object at a predetermined position, and while supporting and moving an optical member with a non-contact bearing in order to change a phase of interference fringes formed on the object with exposure light, transferring a pattern onto the object with the exposure light.

According to the sixth aspect of the present invention, there is provided a device manufacturing method comprising the steps of applying a photosensitive material to a substrate, arranging the substrate at a predetermined position, and while supporting and moving an optical member constituting part of an optical system arranged between a light source and the substrate with a non-contact bearing, transferring a pattern onto the substrate with light that has passed through the optical system.

According to the seventh aspect of the present invention, there is provided a device manufacturing method comprising the steps of applying a photosensitive material to a substrate, arranging the board at a predetermined position, and while supporting and moving an optical member with a non-contact bearing in order to change a phase of interference fringes formed on the substrate with exposure light, transferring a pattern onto the substrate with the exposure light.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The preferred embodiments of the present invention will be described with reference to the accompanying drawings.

[First Embodiment]

Figure 1:
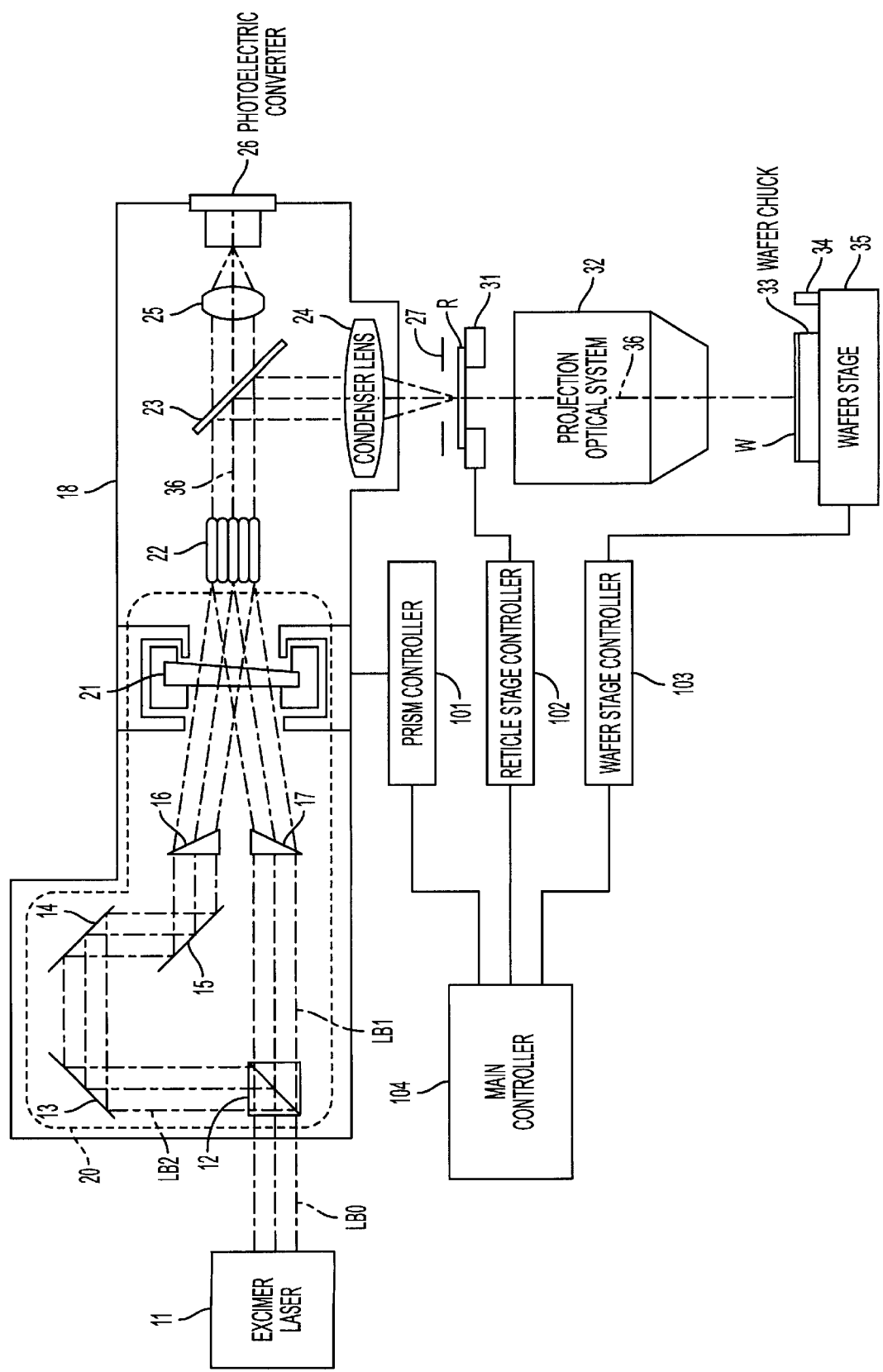
FIG. 1 is a view showing the first embodiment of the present invention.

FIG. 1 is a view showing the schematic arrangement of a scanning type exposure apparatus according to the first embodiment of the present invention. For example, this exposure apparatus can be used to manufacture semiconductor devices, e.g., ICs and LSIs, liquid crystal devices, imaging devices, e.g., CCDS, and devices, e.g., magnetic heads.

Referring to FIG. 1, reference numeral 11 denotes a KrF excimer laser for generating a laser beam with a comparatively small spatial coherence; and 18, a housing for housing optical components which constitute an illumination optical system. This housing 18 is provided with a purge mechanism for substituting an inert gas such as nitrogen gas or helium gas for the atmosphere in it. Windows (not shown) are mounted on the laser beam incident and exit portions of this housing 18 and are closed hermetically.

Reference numeral 20 denotes an incoherent optical system; 21, a wedge prism serving as a rotatably, axially supported optical member; 22, an optical integrator comprised of fly eye lenses or the like; 23, a half mirror for bending the optical path and transmitting part of the beam; 24, a condenser lens for condensing the beam reflected by the half mirror 23; and 25, a focusing lens for focusing the beam transmitted through the half mirror 23 onto a photoelectric converter 26. In this exposure apparatus, the photoelectric converter 26 measures the intensity of the laser beam, and the exposure amount is controlled on the basis of the measurement result.

Reference numeral 27 denotes a field stop for limiting the irradiated range on a reticle R and having an aperture with a shape that can be changed by a driving mechanism (not shown). A circuit pattern is drawn on the reticle R. Reference numeral 31 denotes a reticle stage mounted with the reticle R to scan it. Reference symbol W denotes a wafer coated with a resist. Reference numeral 32 denotes a projection optical system for projecting the circuit pattern of the reticle R onto the wafer W; 33, a wafer chuck for holding the wafer W; 34, an illumination meter for measuring the illuminance on the surface of the wafer W; and 35, a wafer stage mounted with the wafer W to move it within a plane perpendicular to an optical axis 36, in order to move a region to be exposed (shot region) of the wafer W to a predetermined position by step-moving the wafer W, and to move the wafer W along the optical axis on the basis of the detection result of the focal point, thereby scanning the wafer W in synchronism with the reticle stage 31.

Reference numeral 101 denotes a prism controller for controlling rotation of the wedge prism 21; 102, a reticle stage controller for controlling scanning of the reticle stage 31; 103, a wafer stage controller for controlling driving and scanning of the wafer stage 35; and 104, a main controller for controlling the whole apparatus and sending instructions to the prism controller 101 to rotate or stop the wedge prism 21, controlling the reticle stage controller 102 and wafer stage controller 103, and managing various types of sequences. Regarding exposure control, an exposure control system (not shown) determines a voltage to be applied to the excimer laser 11 on the basis of an output signal from the photoelectric converter 26, and the excimer laser 11 oscillates a beam in response to an instruction from the main controller 104.

A parallel, substantially coherent laser beam LB0 output from the excimer laser 11 is amplitude-divided into two beams LB1 and LB2 by a half mirror 12. The beam LB1 transmitted through the half mirror 12 travels linearly toward a wedge prism 17, while the beam LB2 reflected by the half mirror 12 is sequentially reflected by half mirrors 13, 14, and 15 such that its optical path is bent at a right angle three times, and is directed toward a wedge prism 16. The optical path along which the beam LB1 reaches the wedge prism 17 and that along which the beam LB2 reaches the wedge prism 16 have different lengths. The optical system 20 is formed such that the difference in optical paths between the beams LB1 and LB2 becomes equal to or more than the time coherence of the laser beam determined by the wavelength and width of the laser beam oscillated by the excimer laser 11. Accordingly, the beams LB1 and LB2 deflected by the wedge prisms 16 and 17 hardly interfere with each other (that is, they are incoherent to each other), and no interference fringes are formed on the light-incident surface of the optical integrator 22.

The beams LB1 and LB2 refracted by the wedge prisms 16 and 17 become incident on the wedge prism 21 as parallel beams. The wedge prism 21 can rotate about the optical axis 36 as the center of rotation under the control of the prism controller 101. When the wedge prism 21 rotates, the angles and positions with which the beams LB1 and LB2 become incident on the light-incident surface of the optical integrator 22 change over time.

Figure 2:
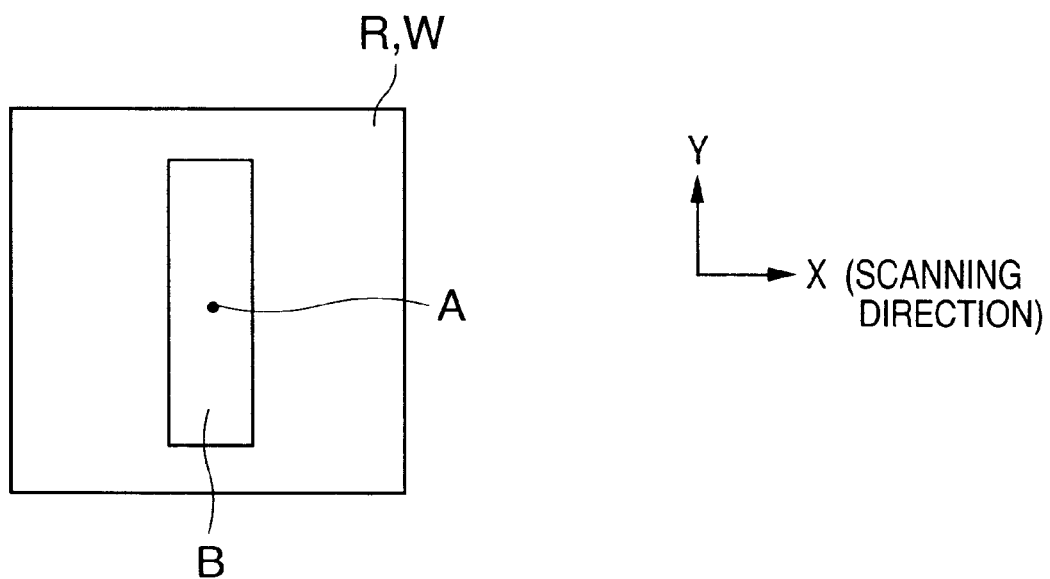
FIG. 2 is a view showing a reticle and an irradiated region.

The beam emerging from the optical integrator 22 is bent at a right angle by the half mirror 23 to illuminate the predetermined irradiated region on the reticle R through the condenser lens 24. In the case of a scanning type exposure apparatus, as shown in FIG. 2, this irradiated region B has a slit-like shape with a small width in the scanning direction (X) and a large width in a direction (Y) perpendicular to it.

The optical integrator 22 is comprised of a lens array in which lens elements are lined two-dimensionally along a plane perpendicular to the optical axis. The beams LB1 and LB2 are wavefront-divided by the optical integrator 22 to form a plurality of secondary light sources. Beams from the plurality of secondary light sources are superposed on the reticle R and wafer W. Although the beam output from the excimer laser 11 has a comparatively low spatial coherence, the wavefront-divided beams from the secondary light sources interfere with each other to form low-contrast interference fringes on the reticle R and wafer W.

In the optical system 20 of this embodiment, since the amplitude-divided, incoherent beams LB1 and LB2 become incident on the optical integrator 22 in different directions, the phase of the low-contrast interference fringes formed by the beams LB1 and that of the beams LB2 are different from each other. Because of this effect, the contrasts of the interference fringes formed on the reticle R and wafer W further decrease, but the influence of the interference fringes cannot be eliminated completely.

When the reticle R and wafer W are to be scanned by scanning the reticle stage 31 and wafer stage 35 in synchronism with each other by the reticle stage controller 102 and wafer stage controller 103, respectively, since the irradiated region B is fixed, the interference fringes on the irradiated region B move opposite to the scanning direction relative to the respective positions on the reticle R. Therefore, the exposure amount at a certain point A on the reticle R shown in FIG. 2 is the one obtained by integrating the illuminance of the exposure light, incident on the point A during scanning, with reference to the width of the irradiated region B in the scanning direction (X). Accordingly, if the low-contrast interference fringes remain, a uniform exposure amount distribution can be achieved within the exposure range of the reticle R or wafer W due to the leveling effect of scanning.

The interference fringes (illuminance distribution) are not leveled by scanning in the Y direction perpendicular to the scanning direction. Hence, interference fringes corresponding to the arrangement of the lens elements of the optical integrator 22 are formed on the reticle R and wafer W. When the lens elements are arranged in the horizontal and vertical directions within a plane perpendicular to the optical axis 36, the interference fringes appear on the wafer W as horizontal fringes with a brightness that changes in the Y direction of FIG. 2.

According to this embodiment, in FIG. 1, in accordance with an instruction from the main controller 104, the wedge prism 21 is rotated about the optical axis 36 under the control of the prism controller 101 in order to continuously change the beam deflecting direction so that the positions and angles with which the beams LB1 and LB2 become incident on the light-incident surface of the optical integrator 22 change in units of pulses of the laser beams. With this method, the phases of the interference fringes on the reticle R and the wafer W also change in units of pulses of the laser beams. When stationary exposure was performed with a predetermined number of pulses on an experimental basis, a uniform illuminance distribution free from the influence of the interference fringes was obtained within the irradiated region B.

Figure 3:
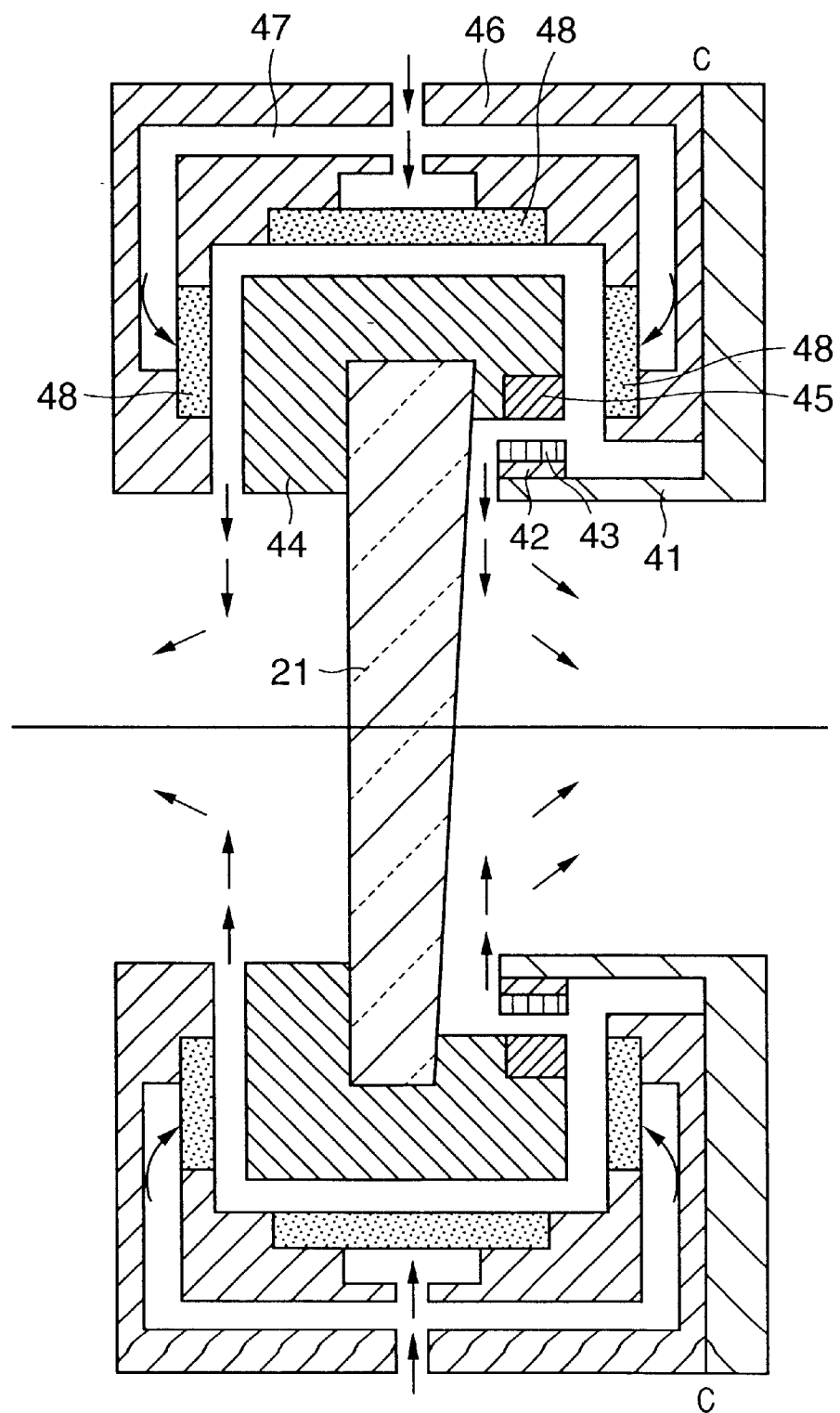
FIG. 3 is a sectional view of a polarizer according to the first embodiment of the present invention.

FIG. 3 schematically shows the sectional structure of the wedge prism 21 used in this embodiment with a portion around it. Reference numeral 41 denotes a stator frame; 42, a flexible printed board; 43, a stator coil; 44, a rotor frame; 45, a rotor magnet; and 46, a gas bearing.

The stator coil 43 is placed on the flexible printed board 42 and fixed to the stator frame 41 together with the flexible printed board 42.

The rotor magnet 45 is fixed to the rotor frame 44 to oppose the stator coil 43. The rotor frame 44 has a hole extending in the axial direction; it has a hollow structure and supports the wedge prism 21 in this hole. The stator frame 41 and gas bearing 46 are connected to each other through a surface C and are fixed to the housing 18. The rotor frame 44 for supporting the wedge prism 21 is rotatably supported by the gas bearing 46 which is not in contact with it.

More specifically, a stator constituted by the stator frame 41, flexible printed board 42, and stator coil 43, a rotor constituted by the rotor frame 44 and rotor magnet 45, and the non-contact gas bearing 46 make up a hollow motor in which the rotor is supported by a non-contact bearing.

An excitation current is supplied to the stator coil 43 from the prism controller 101 through the flexible printed board 42. When the excitation current flows through the stator coil 43, a Lorentz force (energy) is generated due to the mutual relationship with the rotor magnet 45, to apply a torque to the rotor frame 44. In other words, the driving mechanism constituted by the stator coil 43 and rotor magnet 45 applies a torque to the rotor constituted by the rotor frame 44 and the like without coming into contact with it.

The wedge prism 21 is arranged to partition the interior of the housing 18 that houses the optical member of the illumination system.

Reference numeral 47 denotes a flow path for supplying a lubricating gas to the gas bearing 46. The lubricating gas flows in the flow path 47 in the direction indicated by arrows, and is sprayed toward the bearing portion of the gas bearing 46 through a porous body 48 with gas permeability, so that it is sent into the housing 18. As the lubricating gas, for example, an inert gas such as nitrogen gas or helium gas, or clean dry air is suitable.

In the above arrangement, the motor, the rotor of which is supported by the non-contact bearing is used as the driving portion for the wedge prism 21. Therefore, a frictional portion is completely eliminated from the interior of the housing 18, and dust generated by friction and degassing that occurs in a conventional driving mechanism can be prevented. In the above arrangement, the lubricating gas for the gas bearing 46 can also be used as the substituting gas for substituting for the atmosphere in the housing 18. Hence, gas substitution in the housing 18 can be performed efficiently.

The wedge prism must constantly be driven while the excimer laser oscillates. In the above arrangement, since a motor, the rotor of which is supported by a non-contact bearing is used, the endurance increases greatly.

In this embodiment, a gas bearing is used to support the rotor of the motor. In place of the gas bearing, a magnetic bearing may be used. In this case, a mechanism for supplying a lubricating gas for the bearing can be omitted.

[Second Embodiment]

Figure 4:
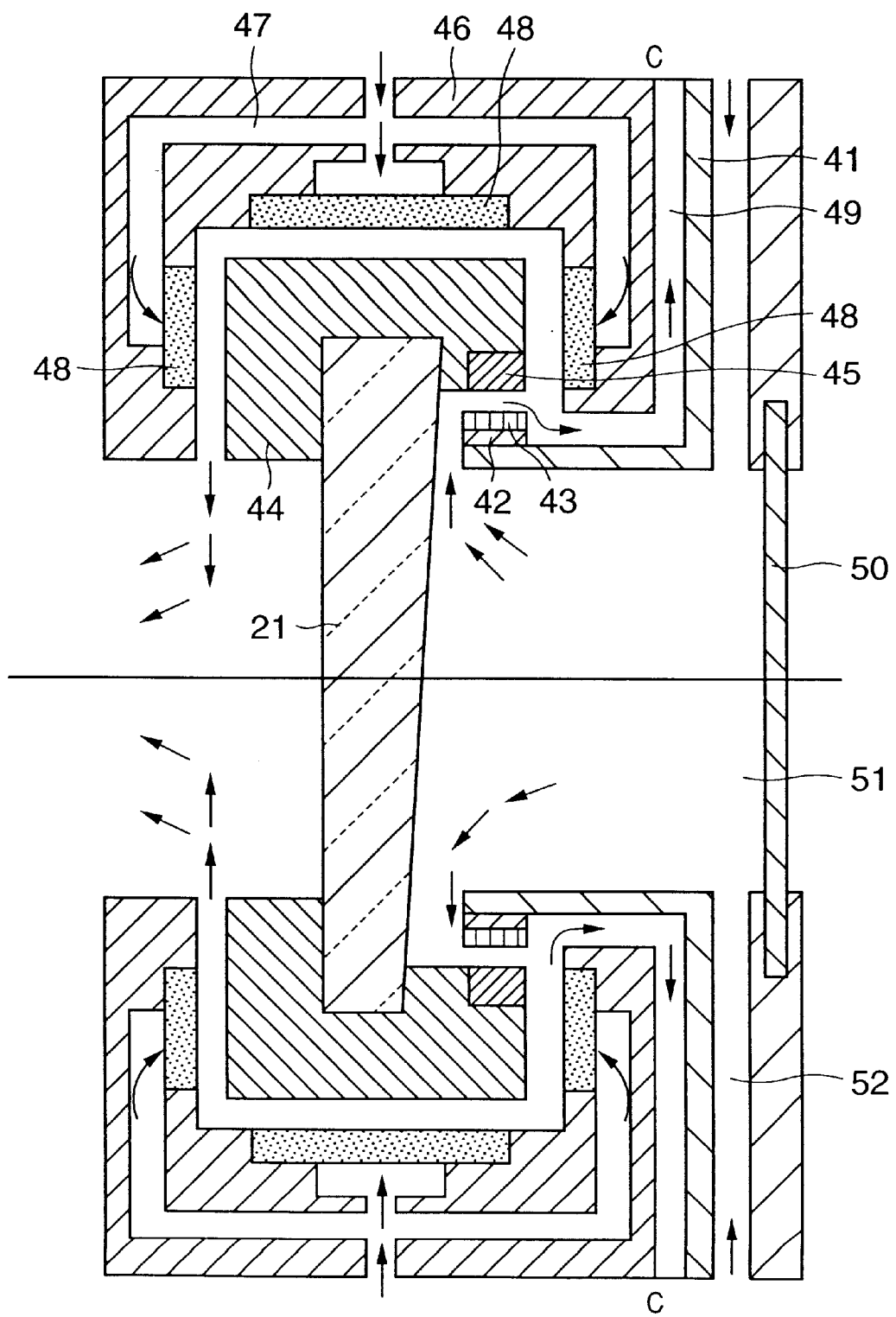
FIG. 4 is a sectional view of a polarizer according to the second embodiment of the present invention.

The second embodiment of the present invention will be described with reference to FIG. 4. Portions that are the same or identical to those of the first embodiment described above are denoted by the same reference numerals as in the first embodiment, and a detailed description thereof will be omitted.

In the first embodiment, the whole lubricating gas is used to substitute for the atmosphere in the housing. In the second embodiment, an exhaust flow path 49 is provided near a gas bearing 46 of a rotor frame 44 to which a wedge prism 21 identical to that described above is attached, and exhausts a lubricating gas (for example, an inert gas such as nitrogen gas or helium gas, or clean dry air). As shown in FIG. 4, the exhaust flow path 49 is provided at such a position that a gas flowing through a portion where a stator coil 43 and magnet 45 face each other will not be guided into the housing. In the second embodiment, a window 50 is provided to partition the space around the wedge prism 21 and the space of an optical integrator 22 from each other, so that the two spaces become hermetically sealed spaces. A supply port 52 communicates with a hermetically sealed space 51 to supply a substituting gas such that it flows from the space 51 (upstream) toward the exhaust flow path 49 (downstream) through the portion where the stator coil 43 and magnet 45 face each other. As a result, the danger that a gas passing through the stator coil 43 and magnet 45 of a driving mechanism, which can cause slight dust generation and degassing, be trapped in the housing is decreased. In this case, a chuck valve for preventing a back flow may be provided in the exhaust flow path so that the danger is further decreased.

[Embodiment of Device Producing Method]

An embodiment of a device producing method utilizing the exposure apparatus described above will be described.

Figure 5:
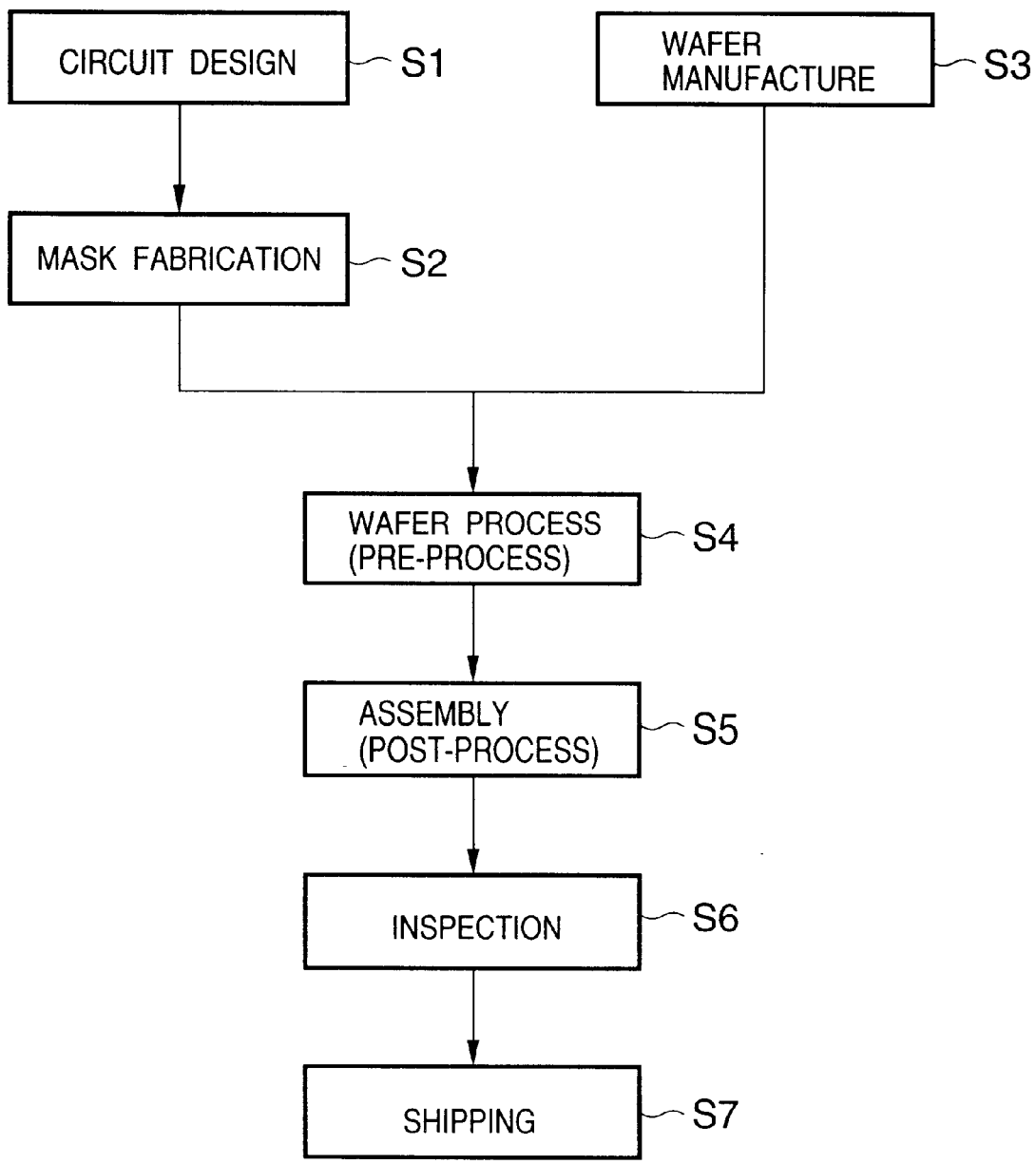
FIG. 5 is a flow chart showing the flow of the manufacture of a microdevice.

FIG. 5 shows the flow of the manufacture of a microdevice (a semiconductor chip such as an IC or LSI, a liquid crystal panel, a CCD, a thin film magnetic head, a micromachine, or the like). In step 1 (circuit design), pattern design of the device is performed. In step 2 (mask fabrication), a mask with the designed pattern is fabricated. In step 3 (wafer manufacture), a wafer is manufactured by using a material such as silicon or glass. Step 4 (wafer process) is called a pre-process where the mask and wafer prepared in the above manner are used to form an actual circuit on the wafer in accordance with lithography. The next step 5 (assembly) is called a post-process where the wafer fabricated in step 4 is formed into semiconductor chips. Step 5 includes an assembly step (dicing, bonding), a packaging step (chip encapsulation), and the like. In step 6 (inspection), inspection such as an operation confirmation test, a durability test and the like of the semiconductor devices fabricated in step 5 is performed. The semiconductor device is completed through these steps, and is shipped (step 7).

Figure 6:
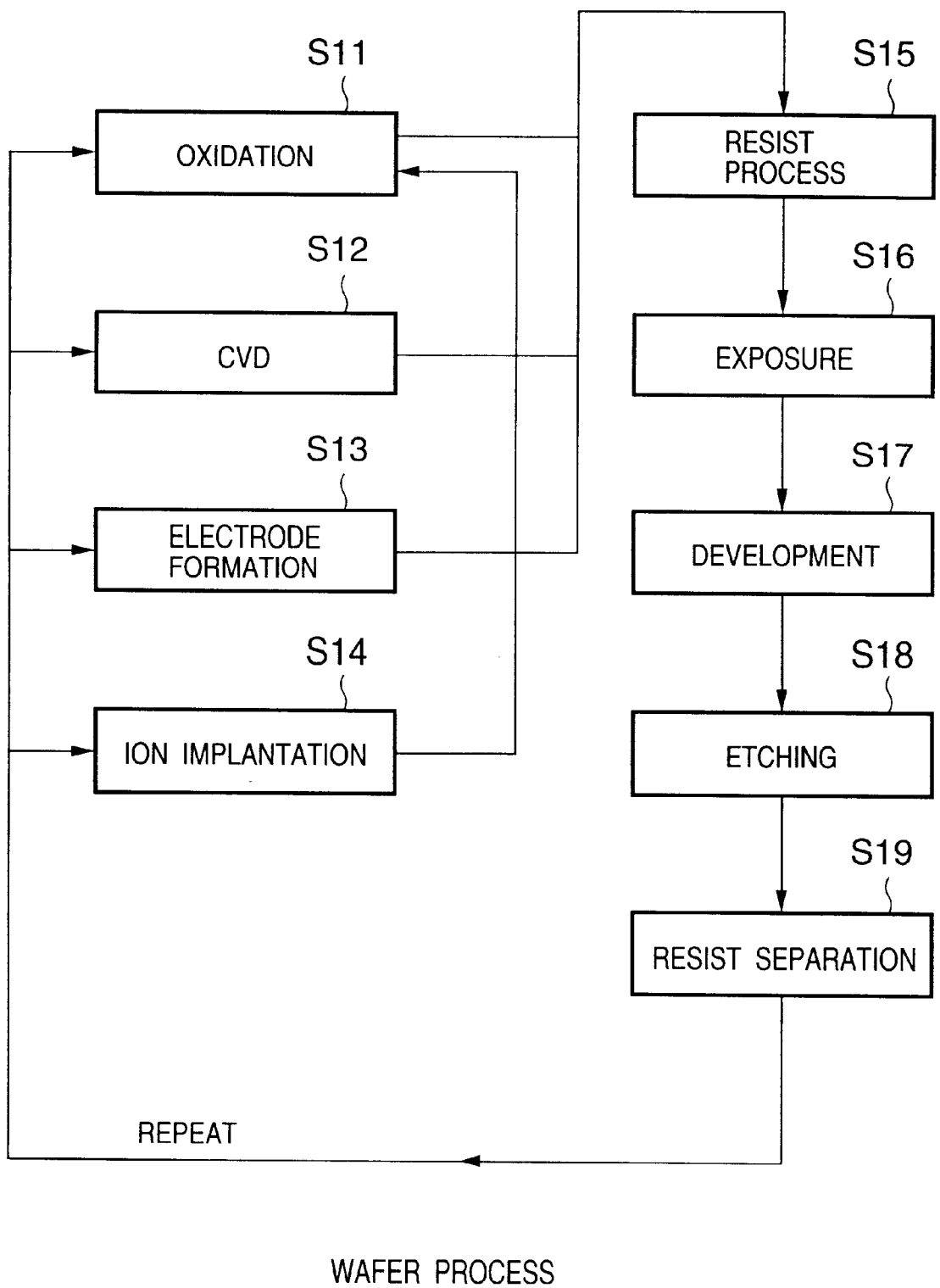
FIG. 6 is a flow chart showing the flow of the wafer process in detail.

FIG. 6 shows a detailed flow of the above wafer process. In step 11 (oxidation), the surface of the wafer is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist process), a photosensitive agent is applied to the wafer. In step 16 (exposure), the circuit pattern of the mask is projected onto the wafer by exposure using the exposure apparatus described above. In step 17 (development), the exposed wafer is developed. In step 18 (etching), a portion of the wafer other than the developed resist image is removed. In step 19 (resist separation), the resist which has become unnecessary after etching is removed. These steps are repeated to form multiple circuit patterns on the wafer.

When the producing method of this embodiment is used, a high-integration device which is conventionally difficult to manufacture can be manufactured at a low cost.

As has been described above, according to the illustrative embodiments of the present invention, in an apparatus and method for decreasing interference fringes called a speckle pattern by rotating a wedge prism about an optical axis as the center, a rotor including the prism is supported by a non-contact bearing, and a torque is applied to the rotor without contacting the rotor, thereby decreasing degassing and dust generation in a housing that houses the optical member of an illumination system. This structure also contributes to downsizing and durability increase of the housing or apparatus.

When a gas bearing is employed as the non-contact gearing, a lubricating gas can also be utilized as a substituting gas that substitutes for the atmosphere in the housing, so that gas substitution can be performed effectively.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for transferring a pattern onto an object, said apparatus comprising:
   an optical member constituting part of an optical system arranged between a light source and the object;
   a rotor having a hole extending in an axial direction thereof, said optical member being mounted in the hole;
   a stator, said rotor and said stator constituting a motor for rotating said optical member; and
   a non-contact bearing for supporting said rotor.

2. The apparatus according to claim 1, wherein said optical member includes an optical element for changing a phase of interference fringes formed on the object with exposure light.

3. The apparatus according to claim 1, wherein said rotor and said stator are not in contact with each other.

4. The apparatus according to claim 1, wherein said optical member changes a light-deflecting direction upon rotating.

5. The apparatus according to claim 4, wherein said optical member comprises a prism.

6. The apparatus according to claim 1, wherein said non-contact bearing comprises a gas bearing.

7. The apparatus according to claim 6, further comprising a flow path for guiding a gas supplied to said gas bearing to a space in a housing in which said optical member is arranged.

8. The apparatus according to claim 6, further comprising a flow through which a gas flows from a space, in which said optical member is arranged to an outside through said bearing.

9. The apparatus according to claim 6, further comprising a flow path through which a gas which passes between said rotor and said stator flows from a space in a housing, in which said optical member is arranged, to an outside.

10. The apparatus according to claim 6, further comprising a window member for enclosing a space including said optical member, said rotor, said stator and said bearing.

11. The apparatus according to claim 6, wherein said gas bearing uses an inert gas.

12. The apparatus according to claim 11, wherein the inert gas includes nitrogen gas or helium gas.

13. The apparatus according to claim 6, wherein said gas bearing uses clean dry air.

14. The apparatus according to claim 1, further comprising a window member for enclosing a space including said optical member, said rotor, said stator and said bearing.

15. The apparatus according to claim 1, further comprising a flow path through which a gas flows from a space in a housing, in which said optical member is arranged, to an outside through said bearing.

16. The apparatus according to claim 1, further comprising a flow path through which a gas which passes between said rotor and said stator flows from a space in a housing, in which said optical member is arranged, to an outside.

17. The apparatus according to claim 1, further comprising a window member for enclosing a space including said optical member, said rotor, said stator and said bearing.

18. The apparatus according to claim 1, wherein said non-contact bearing comprises a magnetic bearing.

19. The apparatus according to claim 1, wherein said optical member, said rotor, said stator and said bearing are arranged in an illumination optical system which illuminates an original plate where a pattern to be projected onto a substrate.

20. An exposure apparatus for transferring a pattern onto an object, said apparatus comprising:
   an optical member constituting part of an optical system arranged between a light source and the object;
   a rotor having a hole extending in an axial direction thereof, said optical member being mounted in said hole;
   a stator, said rotor and said stator constituting a motor for rotating said optical member;
   a bearing for supporting said rotor; and
   a flow path through which a gas flows from a space in a housing in which said optical member is arranged to an outside through said bearing.

21. An exposure apparatus for transferring a pattern onto an object, said apparatus comprising:
- an optical member constituting part of an optical system arranged between a light source and the object;
- a rotor having a hole extending in an axial direction thereof, said optical member being mounted in said hole;
- a stator, said rotor and said stator constituting a motor for rotating said optical member;
- a bearing for supporting said rotor; and
- a flow path through which a gas which passes through said driving mechanism flows from a space in a housing in which said optical member is arranged to an outside.

22. An exposure method of transferring a pattern onto an object, said method comprising the steps of:
- arranging the object at a predetermined position; and
- arranging an optical system between a light source and the object,
- wherein the optical system includes an optical member that is driven by a motor including a rotor and a stator, the rotor being supported by a non-contact bearing and having a hole extending in an axial direction thereof, the optical member being mounted in the hole.

23. An exposure method of transferring a pattern onto an object, said method comprising the steps of:
- arranging the object at a predetermined position;
- transferring a pattern onto the object with the exposure light; and
- driving an optical member by a motor in order to change a phase of interference fringes formed on the object with exposure light, the motor including a rotor and a stator, the rotor being supported by a non-contact bearing and having a hole extending in an axial direction thereof, the optical member being mounted in the hole.

24. A device manufacturing method comprising the steps of:
- applying a photosensitive material to a substrate;
- arranging the substrate at a predetermined position; and
- transferring a pattern onto the substrate with light that has passed through an optical system arranged between a light source and the substrate,
- wherein the optical system includes an optical member that is driven by a motor including a rotor and a stator, the rotor being supported by a non-contact bearing and having a hole extending in an axial direction thereof, the optical member being mounted in the hole.

25. A device manufacturing method comprising the steps of:
- applying a photosensitive material to a substrate;
- arranging the substrate at a predetermined position;
- transferring a pattern onto the substrate with the exposure light; and
- driving an optical member by a motor in order to change a phase of interference fringes formed on the object with exposure light, the motor including a rotor and a stator, the rotor being supported by a non-contact bearing and having a hole extending in an axial direction thereof, the optical member being mounted in the hole.

* * * * *

UNITED STATES PATENT AND TRADEMARK OFFICE
CERTIFICATE OF CORRECTION

PATENT NO. : 6,522,774 B2
DATED : April 22, 2003
INVENTOR(S) : Tomoharu Hase et al.

It is certified that error appears in the above-identified patent and that said Letters Patent is hereby corrected as shown below:

<u>Title page,</u>
Item [56], References Cited, FOREIGN PATENT DOCUMENTS, "JP 363174802 A * 7/1998" should read -- JP 63-174802 A * 7/1988 --.

<u>Column 10,</u>
Line 18, "flow" should read -- flow path --.
Line 54, "substrate." should read -- substrate is formed. --.

Signed and Sealed this

Third Day of August, 2004

JON W. DUDAS
*Acting Director of the United States Patent and Trademark Office*